United States Patent
Choo et al.

(10) Patent No.: US 7,615,920 B2
(45) Date of Patent: Nov. 10, 2009

(54) LIGHT EMITTING DEVICE AND DISPLAY APPARATUS USING THE SAME

(75) Inventors: Dae-Ho Choo, Seongnam-si (KR); Ho-Min Kang, Suwon-si (KR); Yang-Suk Ahn, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 3 days.

(21) Appl. No.: 11/523,269

(22) Filed: Sep. 19, 2006

(65) Prior Publication Data

US 2008/0049442 A1   Feb. 28, 2008

(30) Foreign Application Priority Data

Aug. 25, 2006   (KR)   ........ 10-2006-0081108

(51) Int. Cl.
*H01J 63/04* (2006.01)

(52) U.S. Cl. .......... 313/503; 313/506; 362/601

(58) Field of Classification Search ........ 362/84, 362/600–634; 349/69; 313/503, 504, 506; 428/917
See application file for complete search history.

(56) References Cited

U.S. PATENT DOCUMENTS

| | | | | |
|---|---|---|---|---|
| 4,066,925 A | * | 1/1978 | Dickson | 313/503 |
| 6,117,529 A | * | 9/2000 | Leising et al. | 428/209 |
| 6,515,314 B1 | * | 2/2003 | Duggal et al. | 257/184 |
| 6,555,253 B2 | * | 4/2003 | Hamada et al. | 428/690 |
| 6,777,871 B2 | * | 8/2004 | Duggal et al. | 313/506 |
| 7,192,659 B2 | * | 3/2007 | Ricks et al. | 428/690 |
| 2002/0141194 A1 | * | 10/2002 | Wortman et al. | 362/309 |
| 2003/0030371 A1 | * | 2/2003 | Liao et al. | 313/506 |
| 2003/0042848 A1 | * | 3/2003 | Park et al. | 313/503 |
| 2003/0085652 A1 | * | 5/2003 | Weaver | 313/506 |
| 2003/0218420 A1 | * | 11/2003 | Zovko | 313/506 |
| 2004/0119400 A1 | * | 6/2004 | Takahashi et al. | 313/504 |
| 2004/0119404 A1 | * | 6/2004 | Kato et al. | 313/506 |
| 2005/0007012 A1 | | 1/2005 | Carter et al. | 313/504 |
| 2005/0089720 A1 | * | 4/2005 | Imanishi | 428/690 |
| 2006/0186802 A1 | * | 8/2006 | Cok et al. | 313/506 |

FOREIGN PATENT DOCUMENTS

| | | |
|---|---|---|
| JP | 2004342374 | 12/2004 |
| KR | 1020050040958 A | 5/2005 |

* cited by examiner

*Primary Examiner*—John A Ward
(74) *Attorney, Agent, or Firm*—Cantor Colburn LLP

(57) ABSTRACT

Disclosed are a light emitting device and a display device using the same. The light emitting device includes a first electrode formed on a top surface of a substrate and a second electrode formed on a top surface of the light emitting layer. The light emitting layer auxiliary light emitting particles that convert the path of light, so that brightness of the light emitting device and the display device is improved.

22 Claims, 8 Drawing Sheets

LIGHT EMITTING DEVICE AND DISPLAY APPARATUS USING THE SAME

BACKGROUND OF THE INVENTION

1. Field of the Invention

The present invention relates to a light emitting device. More particularly, the present invention relates to a light emitting device having high brightness and long life span and a display device using the same.

2. Description of the Related Art

In general, a light emitting device includes a light emitting layer and is used for a display device that displays an image by using light emitted from the light emitting device.

The light emitting layer emits light in all directions. However, the light emitted in the front direction of the display device (that is, the viewing direction of users) is only available for the display device when displaying the image. For instance, if light emitted from the light emitting layer is divided into a left directional component, a right directional component, an upper directional component, and a lower directional component, only one of the above components (for example, the upper directional component) is available for the display device. In other words, only 25% of the light emitted from the light emitting layer is used for the display device.

Since the light efficiency of the light emitting device used for the display device is very low, brightness of the display device is also degraded. In addition, if the light emitting device is driven with high voltages to improve the brightness, life span of the light emitting device is shortened.

SUMMARY OF THE INVENTION

The present invention provides a light emitting device having high brightness and long life span.

The present invention also provides a display device using such a light emitting device.

In one aspect of the present invention, a light emitting device includes a substrate, a first electrode formed on a top surface of the substrate, a light emitting layer formed on a top surface of the first electrode and a second electrode formed on a top surface of the light emitting layer. The light emitting layer includes an emissive element generating light and auxiliary light emitting particles that convert a path of the light.

Preferably, the auxiliary light emitting particles have a diameter smaller than a wavelength of the light. In addition, the auxiliary light emitting particles have a diameter smaller than a wavelength of the blue light having a short wavelength in a visible ray band.

The light includes a white light or a color light. The color light may include red, green and blue lights that correspond to three primary colors. In this case, the light emitting layer includes first to third light emitting layers generating red, green and blue lights.

The light emitting device further includes an auxiliary layer having a refractive index lower than that of the substrate and being formed at a bottom surface of the substrate. The auxiliary layer serves to convert the path of the light, which has been output from the substrate, toward the substrate.

In another aspect of the present invention, a display device includes a display panel and a backlight unit. The display panel displays an image. The backlight unit is installed below the display panel so as to provide light to the display panel. The backlight unit includes a substrate, a first electrode formed on a top surface of the substrate, a light emitting layer formed on a top surface of the first electrode, and a second electrode formed on a top surface of the light emitting layer. The light emitting layer includes an emissive element generating light and auxiliary light emitting particles that convert the path of light.

In still another aspect of the present invention, a display device includes a first electrode, a light emitting layer, and a second electrode. Pixel electrodes are defined on the substrate. The first electrode is formed on each pixel area of the substrate. The light emitting layer includes an emissive element generating a light and auxiliary light emitting particles distributed in the emissive element to convert a path of the light. The second electrode is formed on a top surface of the light emitting layer.

DESCRIPTION OF THE EMBODIMENTS

Hereinafter, embodiments of the present invention will be explained in detail with reference to the accompanying drawings. However, the scope of the present invention is not limited to such embodiments and the present invention may be realized in various forms. The embodiments to be described below are nothing but the ones provided to bring the disclosure of the present invention to perfection and assist those skilled in the art to completely understand the present invention. The present invention is defined only by the scope of the appended claims.

Although terms "first", "second", etc. are used to distinguish similar elements from each other, these elements are not defined by those terms. The above terms are only used to distinguish the elements from each other. In addition, the term "upper" has a relative concept to the term "lower" in the following description. Thus, the term "upper" may become "lower" when the element has rotated or the viewing angle of an observer has changed.

In addition, when a layer is mentioned as to be formed on another layer or a substrate, the layer can be directly formed on another layer or the substrate, or a third layer can be interposed between the layer and substrate or another layer. The thickness of layers or areas can be simplified or exaggerated for the purpose of clarity.

Figure 1:
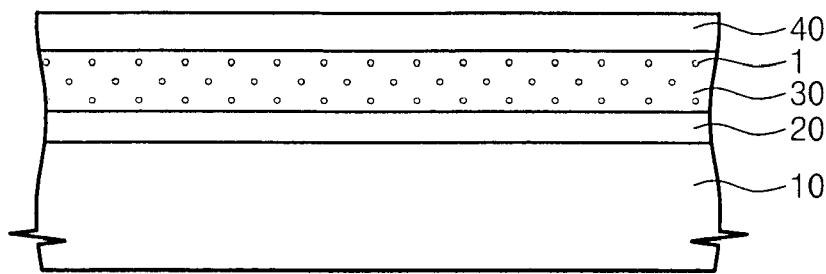
FIG. 1 is a sectional view illustrating a light emitting device according to a first embodiment of the present invention.

FIG. 1 is a sectional view illustrating a light emitting device according to a first embodiment of the present invention.

Referring to FIG. 1, the light emitting device includes a substrate 10, a first electrode 20, a light emitting layer 30 and a second electrode 40. The substrate 10 may include a glass substrate made from an insulating material having inflexibility, or a plastic substrate having flexibility. An external appearance of the flexible plastic substrate is easily deformed. This flexible characteristic of the substrate is advantageous when the light emitting device is used for flexible display devices, such as electronic papers or foldable display devices that have been extensively used in these days. The substrate 10 has a transparent property to allow light to pass therethrough. However, an opaque substrate can be used when the image is displayed in the upward direction of the second electrode 40.

A voltage is applied to the first and second electrodes 20 and 40. One of the first and second electrodes 20 and 40 is an anode, and the other is a cathode. If the voltage is applied to the first and second electrodes 20 and 40, holes are transmitted from the anode to the light emitting layer 30, and electrons are provided from the cathode to the light emitting layer 30. The holes and electrons are recombined in the light emitting layer while generating energy, so that the light emitting layer 30 emits light based on the energy.

The cathode includes a metal having a great amount of free electrons therein to provide a sufficient amount of electrons. For instance, the cathode includes aluminum (Al), silver (Ag), or magnesium (Mg). The anode includes a transparent conductive layer, such as indium tin oxide (ITO) or indium zinc oxide (IZO).

The light emitting device emits light in upward and downward directions about the light emitting layer 30. In the case where a metal electrode is formed on the top of the light emitting layer 30 and a transparent conductive electrode is formed on the bottom of the light emitting layer, the light emitted in the upward direction does not pass through the metal electrode and the light emitted in the downward direction may pass through the transparent conductive electrode. In this case, the light emitting device is called a "bottom emission type light emitting device". In contrast, if the transparent conductive electrode is formed on the top of the light emitting layer and the metal electrode is formed on the bottom of the light emitting layer, the light emitting device may serve as a "top emission type light emitting device". The present invention is applicable for both the top emission type and bottom emission type light emitting devices.

The light emitting layer 30 includes an emissive element and auxiliary light emitting particles 1. The emissive element generates light based on the energy generated when the holes are recombined with the electrons. The emissive element includes predetermined organic compound and the color of the light can be changed according to components of the organic compound. The auxiliary light emitting particles 1 are distributed in the emissive element so as to change the light path by reflecting light generated from the emissive element. If the light path is changed, the brightness and life span of the light emitting device can be improved. Hereinafter, description will be made in relation to the effect of the auxiliary light emitting particles 1.

Figure 2A:
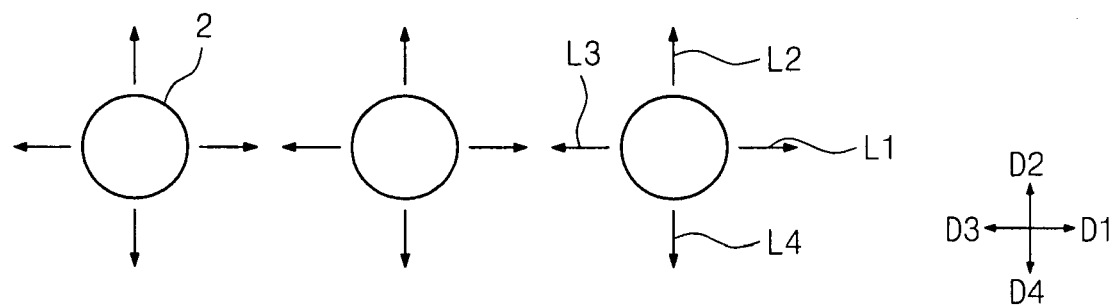
FIGS. 2A and 2B are views explaining the operational principle of the light emitting device shown in FIG. 1.
Figure 2B:
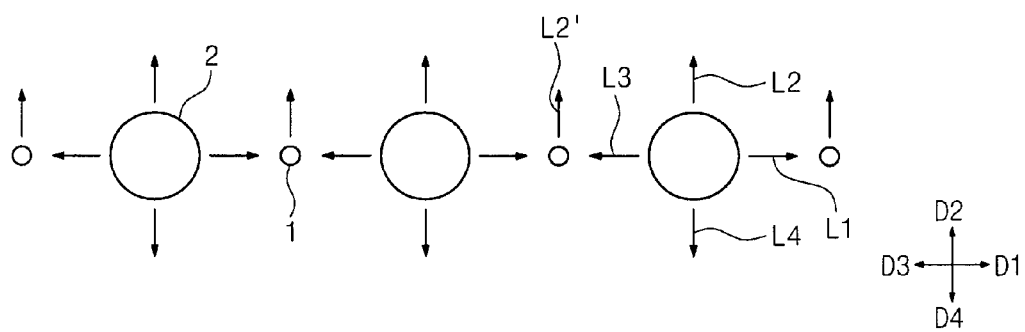

FIGS. 2A and 2B are views explaining the operational principle of the light emitting device shown in FIG. 1. FIGS. 2A and 2B show a part of the light emitting layer 30 in detail, in which FIG. 2A is a comparative example of the present invention that does not contain the auxiliary particles 1.

Referring to FIG. 2A, the emissive element includes a plurality of light emitting particles 2. Light generated from the light emitting particles 2 can be emitted in all directions. Therefore, when the light is divided into first to fourth lights L1, L2, L3 and L4 according to directional components D1, D2, D3 and D4 thereof, each light has a value of 25% with respect to the light emitted from the light emitting particles 2.

If the light emitting device is the top emission type light emitting device, the second light L2 is exclusively used, and the first, third and fourth lights L1, L3 and L4 are wasted without being used. Similarly, if the light emitting device is the bottom emission type light emitting device, the fourth light L4 is exclusively used, and the first, second and third lights L1, L2 and L3 are wasted without being used.

Referring to FIG. 2B, auxiliary light emitting particles 1 are provided between the light emitting particles 2. The auxiliary light emitting particles 1 are not light emitting members that emit light by means of electric energy, but metals or non-metallic materials can be used for the auxiliary light emitting particles 1 without limitations. However, the size of the auxiliary light emitting particles 1 must be controlled. For instance, when the auxiliary light emitting particles 1 have spherical shapes, a diameter of the spherical shape is preferably smaller than a wavelength of the light generated from the light emitting particle 2. In contrast, the light emitting particle 2 has a diameter larger than the wavelength of the light.

The light corresponds to visible ray used to display the image. Therefore, the auxiliary light emitting particles 1 may be nano-sized particles corresponding to the wavelength of ultraviolet ray which is shorter than that of visible ray. In addition, red, green and blue lights corresponding to three primary colors of the visible ray are mainly used when displaying the image. Since the blue light has the shortest wavelength, the auxiliary light emitting particle 1 may have a diameter smaller than the wavelength of the blue light. For instance, the auxiliary light emitting particle 1 may have a diameter of 300 nm or less.

Since the light emitting particle 2 has a size larger than the wavelength of the light, the light emitting particle 2 absorbs and extinguishes the light. In contrast, the auxiliary light emitting particle 1 has a size smaller than the wavelength of the light, so the auxiliary light emitting particle 1 reflects and scatters the light. Accordingly, the path of the light irradiated onto the auxiliary light emitting particle 1 is changed, so that a part of the light can be reused without being wasted. For instance, in the case of the top emission type light emitting device, parts of the first and third lights L1 and L3 may change their paths into the second direction D2 due to the auxiliary light emitting particle 1. In this manner, the light L2' that has changed its path due to the auxiliary light emitting particle 1 is added to the second light L2 so that the brightness of the light emitting device can be improved.

The brightness of the light emitting device can be improved as the higher voltage is applied to the first and second electrodes 20 and 40. However, the life span of the light emitting device may be shortened if the higher voltage is applied to the first and second electrodes 20 and 40. According to the present invention, since the brightness of the light emitting device can be improved by means of the auxiliary light emitting particles 1, the higher voltage is not necessary and thus the life span of the light emitting device can be expanded.

Figure 3:
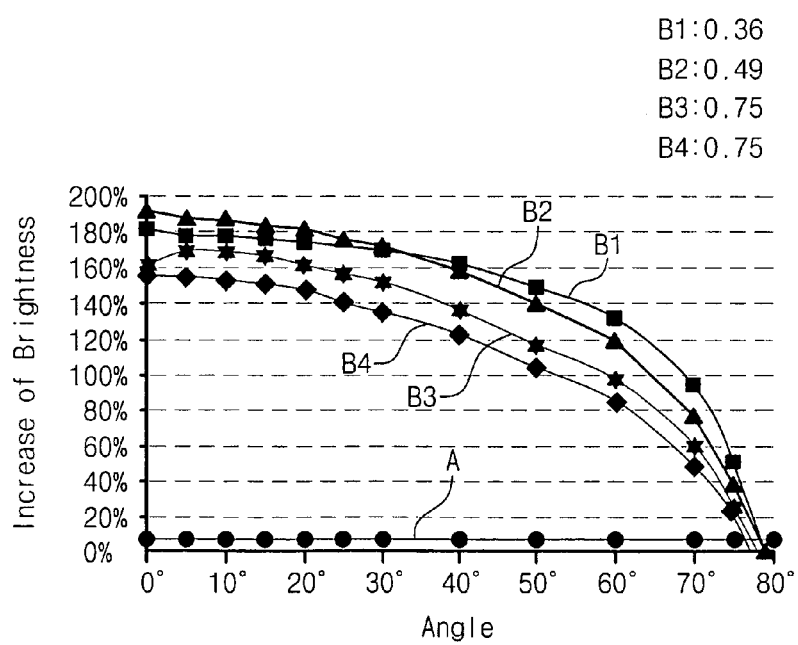
FIG. 3 is a graph illustrating increase of brightness when the light emitting device shown in FIG. 1 is used.

FIG. 3 is a graph illustrating increase of brightness when the light emitting device shown in FIG. 1 is used.

FIG. 3 shows measurement results of brightness in various light emitting devices. In FIG. 3, an x-axis represents angles relative to the front direction of the light emitting device, and a y-axis represents a relative increase of brightness. The graph shown in FIG. 3 illustrates the increase of brightness in experimental examples 1 to 4 relative to that of the comparative example as a function of angles.

In the graph shown in FIG. 3, the comparative example A corresponds to a light emitting device including a light emitting layer having an emissive element only, and experimental examples 1 to 4 (B1, B2, B3 and B4) correspond to light emitting device including a light emitting device having auxiliary light emitting particles in addition to an emissive element. The experimental examples 1 to 4 (B1, B2, B3 and B4) are distinguished from each other according to the diameter of the auxiliary light emitting particle (unit: 1/1000 inch) used therein.

Referring to FIG. 3, when the auxiliary light emitting particles are used, the brightness increases by about 1.6 to 1.9 times in the front direction of the light emitting device. In addition, the increase of the brightness is inversely proportional to the diameter of the auxiliary light emitting particle.

Figure 4A:
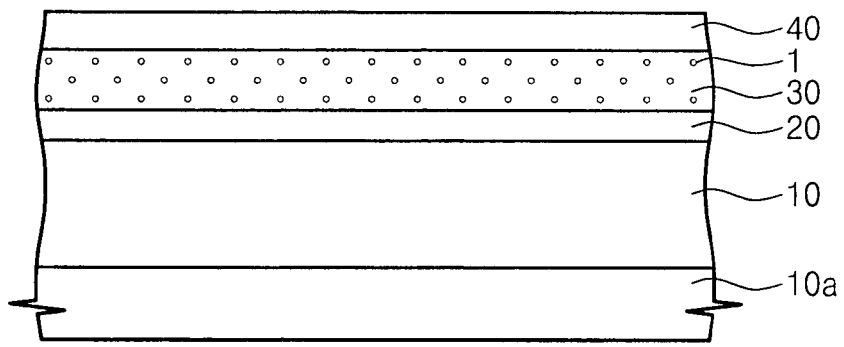
FIG. 4A is a sectional view illustrating a light emitting device according to a second embodiment of the present invention.
Figure 4B:
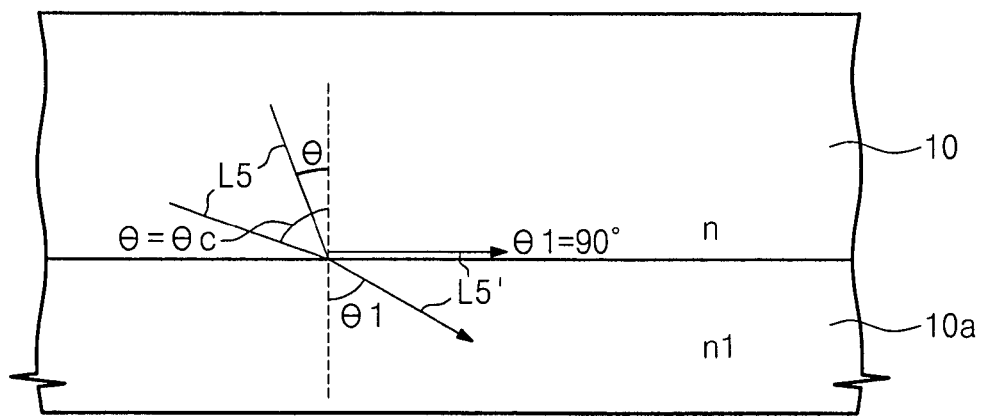
FIG. 4B is an enlarged view showing a part of a light emitting device shown in FIG. 4A.

FIG. 4A is a sectional view illustrating a light emitting device according to a second embodiment of the present invention, and FIG. 4B is an enlarged view showing a part the light emitting device shown in FIG. 4A.

Referring to FIG. 4A, the light emitting device includes a substrate 10, a first electrode 20, a light emitting layer 30, a second electrode 40 and an auxiliary layer 10a. When the voltage is applied to the first and second electrodes 20 and 40, holes and electrons are provided to the light emitting layer and the light is generated as the holes are combined with the electrons. The light emitting layer 30 includes nano-sized auxiliary light emitting particles 1 that change the path of light to improve the brightness of the light emitting device. This procedure has already been described with reference to the previous embodiment, so detailed description thereof will be omitted below.

The auxiliary layer 10a is attached to the bottom of the substrate 10 so as to re-irradiate the light, which has passed through the substrate 10, toward the substrate 10. Due to the light re-irradiated toward the substrate 10, the brightness of the top emission type light emitting device can be improved. Such a re-irradiation of light is based on the differential refractive index between the auxiliary layer 10a and the substrate 10.

Referring to FIG. 4B, refractive indexes of the substrate 10 and the auxiliary layer 10a are denoted as n and n1, respectively. In addition, an incident angle between light L5 incident into the substrate 10 and a normal line relative to a boundary between the substrate 10 and the auxiliary layer 10a is denoted as θ, and a refractive angle between refractive light L5', which is refracted at the auxiliary layer 10a, and the normal line is denoted as θ1.

In general, the refractive index of a specific medium is expressed as a ratio of the light velocity in the specific medium to the light velocity in a vacuum. As the refractive index increases, the light velocity in the medium becomes decreased, and the light travels along a route that shortens the traveling time in the medium. Accordingly, the following equation is established among the refractive indexes n and n1, the incident angle θ and the refractive angle θ1.

$$\sin \theta_1 = \sin \theta \times (n/n1)$$

As can be understood from the above equation, if the auxiliary layer 10a includes a material having a refractive index lower than that of a material forming the substrate 10, the refractive index θ1 is greater than the incident angle θ. In addition, if the light L5 is incident at a predetermined critical angle (θ=θc), the light L5' is refracted at a right angle (θ1=90°). Therefore, if the incident angle of the light L5 is greater than the predetermined critical angle (θ>θc), the light L5 is totally reflected from the surface of the auxiliary layer 10a so that the light L5 is irradiated toward the substrate 10.

Figure 5A:
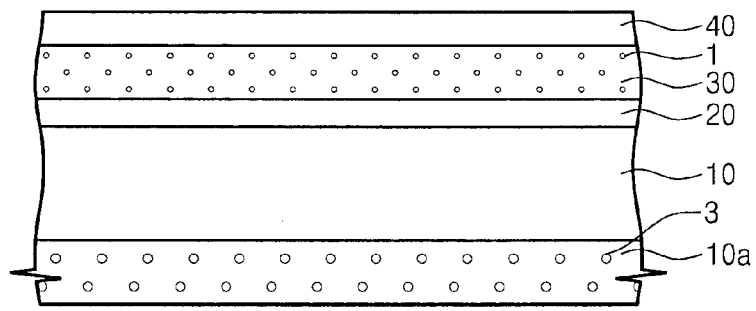
FIG. 5A is a sectional view illustrating a light emitting device according to a third embodiment of the present invention.
Figure 5B:
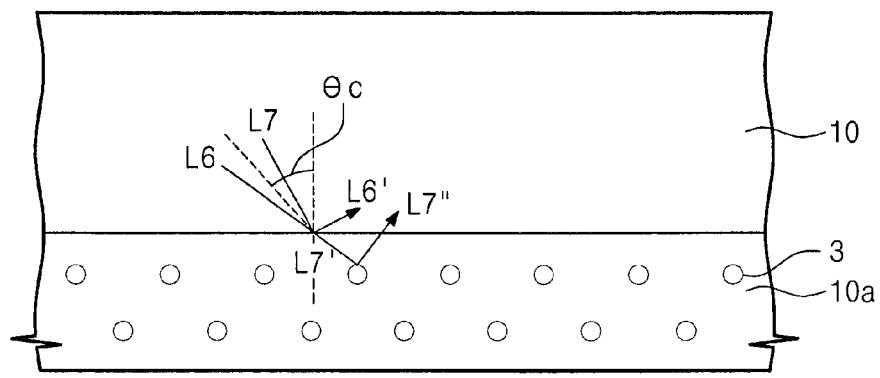
FIG. 5B is an enlarged view showing a part of a light emitting device shown in FIG. 5A.

FIG. 5A is a sectional view illustrating a light emitting device according to a third embodiment of the present invention, and FIG. 5B is an enlarged view showing a part of a light emitting device shown in FIG. 5A.

Referring to FIG. 5A, the light emitting device includes a substrate 10, a first electrode 20, a light emitting layer 30, a second electrode 40, and an auxiliary layer 10a. The light emitting layer 30 includes nano-sized auxiliary light emitting particles 1 that change the path of light generated from the light emitting layer 30 to improve the brightness of the light emitting device. The auxiliary layer 10a is attached to the bottom of the substrate 10 and includes a material having a refractive index lower than that of the substrate 10 in such a manner that the light provided from the substrate 10 is re-irradiated toward the substrate 10. In addition, the auxiliary layer 10a includes a plurality of light reflection particles 3, which are distributed in the auxiliary layer 10a so as to assist the light re-irradiation.

Referring to FIG. 5B, lights incident into the auxiliary layer 10a from the substrate 10 are classified into a first incident light L6 having an incident angle greater than the predetermined critical angle θc and a second incident light L7 having an incident angle less than the predetermined critical angle θc. The first incident light L6 is totally reflected from the surface of the auxiliary layer 10a so that a reflective light L6' is re-irradiated toward the substrate 10. The second incident light L7 passes through the auxiliary layer 10a. The light L7' that has passed through the auxiliary layer 10a is reflected by the light reflection particles 3, which are distributed in the auxiliary layer 10a, so that some of the light L7' is re-irradiated toward the substrate 10.

Preferably, the light reflection particles 3 distributed in the auxiliary layer 10a have small sizes. However, the size of the light reflection particles 3 is not limited to specific conditions which are applied to the auxiliary light emitting particles 1 distributed in the light emitting layer 30. Thus, it does not matter even if the size of the light reflection particles 3 is greater than that of the auxiliary light emitting particles 1. That is, since the light reflection particles 3 are selectively used, the size of the light reflection particles 3 is not a serious matter if the light reflection particles 3 can re-irradiate some of the light incident into the auxiliary layer 10a.

In this manner, a great portion of the light that has been incident into the auxiliary layer 10a can be re-irradiated toward the substrate 10 due to the interaction between the auxiliary layer 10a and the light reflection particles 3 distributed in the auxiliary layer 10a, so that the brightness of the light emitting device can be improved.

Figure 6A:
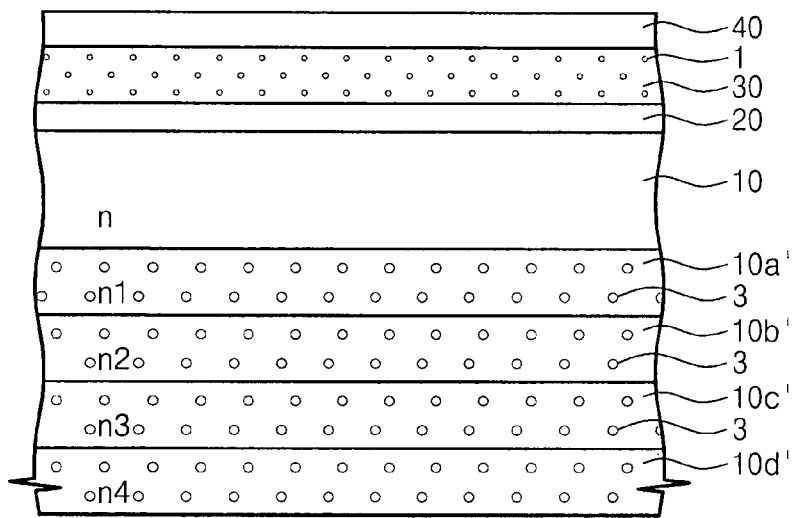
FIG. 6A is a sectional view illustrating a light emitting device according to a fourth embodiment of the present invention.
Figure 6B:
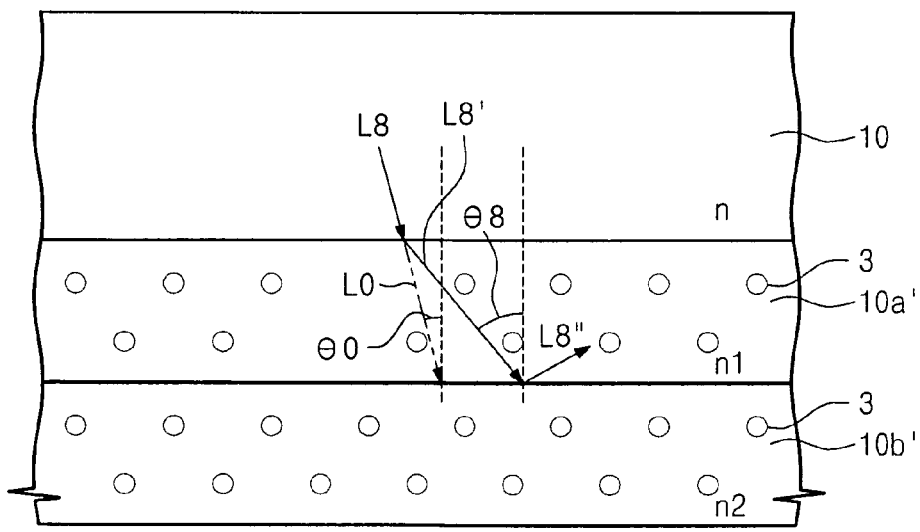
FIG. 6B is an enlarged view showing a part of a light emitting device shown in FIG. 6A.

FIG. 6A is a sectional view illustrating a light emitting device according to a fourth embodiment of the present invention, and FIG. 6B is an enlarged view showing a part of the light emitting device shown in FIG. 6A.

Referring to FIG. 6A, the light emitting device includes a substrate 10, a first electrode 20, a light emitting layer 30, a second electrode 40, and first to fourth auxiliary layers 10a', 10b', 10c' and 10d'. The first to fourth auxiliary layers 10a', 10b', 10c' and 10d' include materials having the refractive index lower than that of the substrate 10 so as to re-irradiate the light toward the substrate 10. In addition, each of the first to fourth auxiliary layers 10a', 10b', 10c' and 10d' may have light reflection particles 3 therein so as to assist the light re-irradiation.

The number of the first to fourth auxiliary layers 10a', 10b', 10c' and 10d' may be increased or decreased. Thus, three auxiliary layers or five auxiliary layers can be used in the present invention. The present invention includes at least two auxiliary layers. In this case, following advantages can be obtained.

Referring to FIG. 6B, the incident light L8 that has passed through the substrate 10 is primarily refracted at the first auxiliary layer 10a' and then is secondarily refracted at the second auxiliary layer 10b'. If the light L8 is incident into the second auxiliary layer 10b' without being refracted at the first auxiliary layer 10a', a virtual light L0 is taken into consideration. When comparing incident angles of the virtual light L0 and a primary refractive light L8' relative to the second auxiliary layer 10b', the incident angle $\theta 0$ of the virtual light L0 is smaller than the incident angle $\theta 8$ of the primary refractive light L8'.

When the refractive indexes of the substrate 10, the first auxiliary layer 10a' and the second auxiliary layer 10b' are set as n, n1 and n2, respectively, the refractive indexes are established as: n>n1>n2. That is, elements may have lower refractive indexes as they are aligned at lower positions. Accordingly, the light incident into the second auxiliary layer 10b' at a predetermined critical angle or more is totally reflected from the second auxiliary layer 10b' and is re-irradiated toward the substrate 10. If the predetermined critical angle has a value between the incident angle $\theta 0$ of the virtual light L0 and the incident angle $\theta 8$ of the primary refractive light L8', the light directly incident into the second auxiliary layer 10b' from the substrate 10 cannot be re-irradiated toward the substrate 10, but the light L8' that has refracted while passing through the first auxiliary layer 10a' is totally reflected from the second auxiliary layer 10b' so that the totally reflected light L8" is re-irradiated toward the substrate 10.

In this manner, quantity of light re-irradiated toward the substrate may increase as the number of the auxiliary layers increases. Accordingly, when the refractive indexes of the first to fourth auxiliary layers 10a', 10b', 10c' and 10d' are set as n1, n2, n3 and n4, respectively, the refractive indexes are established as n1>n2>n3>n4. That is, elements may have lower refractive indexes as they are aligned at lower positions.

Figure 7:
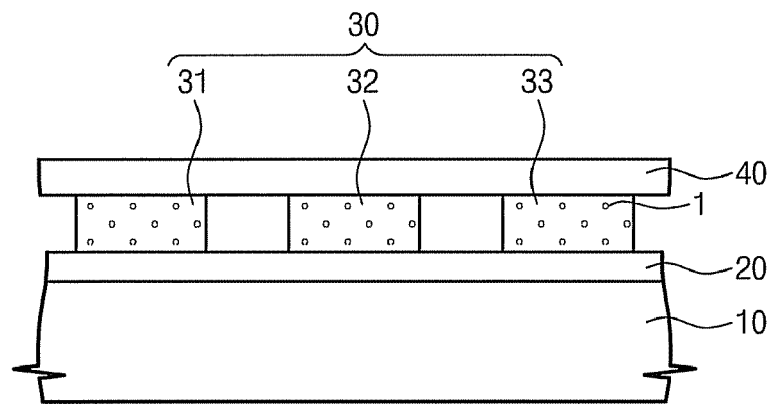
FIG. 7 is a sectional view illustrating a light emitting device according to a fifth embodiment of the present invention.

FIG. 7 is a sectional view illustrating a light emitting device according to a fifth embodiment of the present invention.

Referring to FIG. 7, the light emitting device includes a substrate 10, a first electrode 20, a light emitting layer 30 and a second electrode 40. The light emitting layer includes first to third light emitting layers 31, 32 and 33. The first to third light emitting layers 31, 32 and 33 emit light having colors different from each other. For instance, the first to third light emitting layers 31, 32 and 33 can emit light corresponding to three primary colors of red, green and blue. In this case, the first light emitting layer 31 emits the red light, the second light emitting layer 32 emits the green light and the third light emitting layer 33 emits the blue light.

The color emitted from the light emitting layer 30 can be changed according to components of the emissive element of the light emitting layer 30. Accordingly, the first to third light emitting layers 31, 32 and 33 can be provided with light emitting members having components different from each other in such a manner that the first to third light emitting layers 31, 32 and 33 can emit light having different colors, respectively. In contrast, the first to third light emitting layers 31, 32 and 33 can be provided with light emitting members having the same components to emit the white light. In this case, the first to third light emitting layers 31, 32 and 33 have red, green and blue filters, respectively. The white light generated from the first light emitting layer 31 is filtered through the red filter so that the red light is irradiated to the exterior. In the same manner, the white light generated from the second and third light emitting layers 32 and 33 is filtered through the green and red filters so that the green and blue lights are irradiated to the exterior.

The first to third light emitting layers 31, 32 and 33 include auxiliary light emitting particles 1 that change the path of the light to increase quantity of the light, and thus to improve the brightness of the light emitting device.

FIG. 8 is a sectional view illustrating a light emitting device according to a sixth embodiment of the present invention.

Figure 8A:
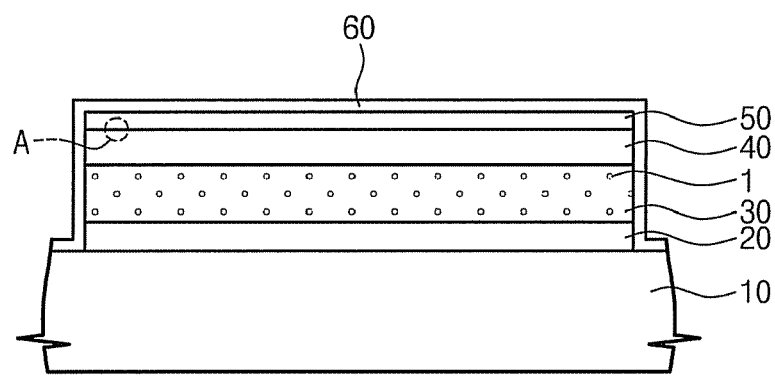
FIGS. 8A and 8B are a sectional and an enlarged view, respectively, illustrating a light emitting device according to a sixth embodiment of the present invention.
Figure 8B:
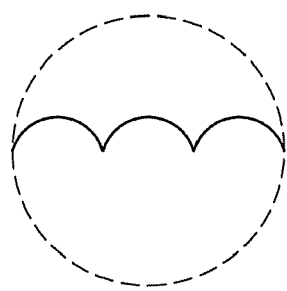

FIGS. 8A and 8B are a sectional and an enlarged view, respectively, illustrating a light emitting device according to a sixth embodiment of the present invention.

Referring to FIG. 8A the light emitting device includes a substrate 10, a first electrode 20, a light emitting layer 30, a second electrode 40, an intermediate layer 50 and a protective layer 60. The light emitting layer 30 includes auxiliary light emitting particles 1 to improve the brightness of the light emitting device, and the intermediate layer 50 converts the traveling direction of the light generated from the light emitting layer 30 into the front direction. Here, the front direction refers to the upward direction of the intermediate layer 50 and is perpendicular to the top surface of the intermediate layer 50. The front direction corresponds to the viewing direction of a user in the top emission type light emitting device.

As shown in the enlarged view of portion 'A' in FIG. 8B the bottom portion of the intermediate layer 50 is shown in detail, such as the bottom surface of the intermediate layer 50 being formed with a concave-convex section. Due to the concave-convex section, the incident angle of light, which is incident onto the intermediate layer 50 from the second electrode 40, is changed. Therefore, the degree of the incident angle is adjustable using the concave-convex section in such a manner that the light can be refracted from the intermediate layer 50 toward the front direction.

When the light is refracted, the equation about the refractive index, which has been described with reference to the auxiliary layer 10a, can also be applied to the light. Detailed description thereof will be omitted. The shape of the concave-convex section is not fixed, but can be variously implemented according to the differential refractive index between the second electrode 40 and the intermediate layer 50.

The protective layer 60 serves to protect the first and second electrodes 20 and 40, and the light emitting layer 30. The emissive element that constitutes the first and second electrodes or the light emitting layer 30 is chemically unstable so the emissive element is vulnerable to moisture or air. For this reason, the protective layer 60 is formed on the intermediate layer 50 while covering the entire surface of the substrate 10. Thus, the protective layer 30 blocks the moisture or air, thereby protecting the first and second electrodes 20 and 40 or the light emitting layer 30. The protective layer 60 may include transparent insulating layer that allows the light to pass therethrough.

Figure 9:
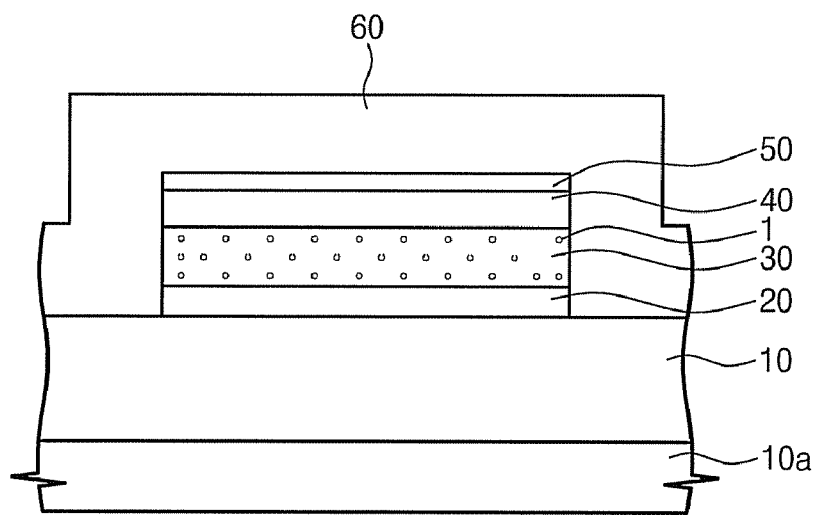
FIG. 9 is a sectional view illustrating a light emitting device according to a seventh embodiment of the present invention.

FIG. 9 is a sectional view illustrating a light emitting device according to a seventh embodiment of the present invention.

Referring to FIG. 9, the light emitting device includes a substrate 10, a first electrode 20, a light emitting layer 30, a second electrode 40, an intermediate layer 50, a protective layer 60, and an auxiliary layer 10*a*. The auxiliary layer 10*a* is attached to the bottom surface of the substrate 10 so as to re-irradiate light incident thereto from the substrate 10. The intermediate layer 50 improves the brightness of the light emitting device in the front direction and the protective layer blocks moisture or air from the exterior. The protective layer 60 includes a material identical to the material forming the substrate 10 and has a thickness similar to that of the substrate 10. For instance, the protective layer 60 has a thickness of about 0.1 μm to 0.15 μm.

Hereinafter, a display device using the light emitting device having the above construction will be described.

Figure 10:
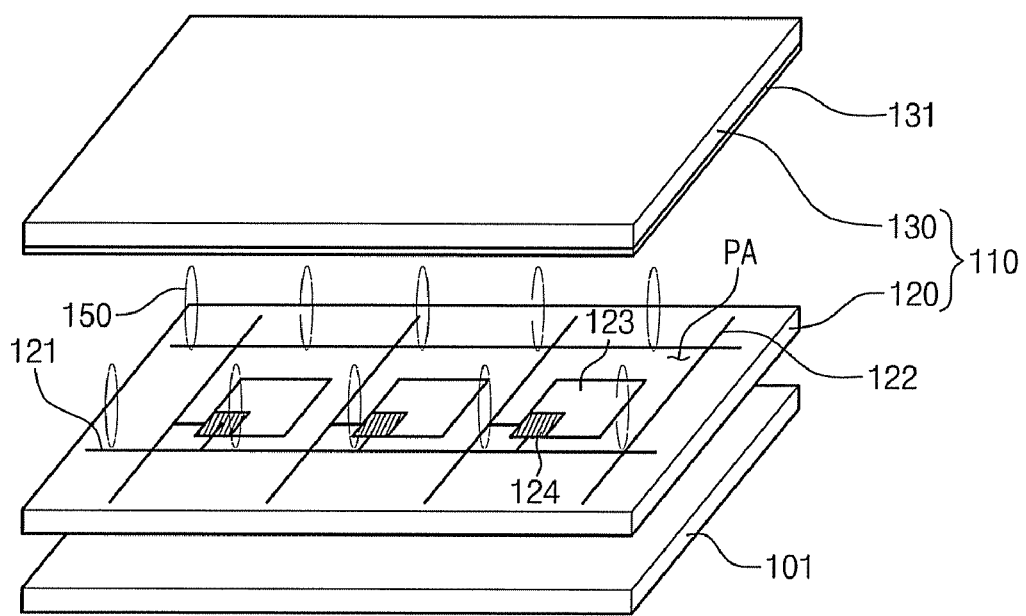
FIG. 10 is a perspective view illustrating a display device according to a first embodiment of the present invention.

FIG. 10 is a perspective view illustrating a display device according to a first embodiment of the present invention.

Referring to FIG. 10, the display device includes a backlight unit 101 and a display panel 110. The display panel 110 has a first substrate 120 and a second substrate 130 that faces the first substrate 120. A plurality of first and second lines 121 and 122 are formed on the first substrate 120. The first and second lines 121 and 122 cross each other in longitudinal and transverse directions while being insulated from each other. Thus, a plurality of pixel areas PA are defined by the first and second lines 121 and 122. Each pixel area PA includes a first electrode 123 and a thin film transistor 124.

The thin film transistor 124 includes a control electrode connected to the first line 121, an input electrode connected to the second line 122, and an output electrode connected to the first electrode 123 while facing the input electrode. The second substrate 130 is provided with a second electrode 131 that faces the first electrode 123, and a liquid crystal layer having liquid crystals 150 is interposed between the first and second substrates 120 and 130.

In operation, if the thin film transistor 124 is turned on according to the signal transmitted through the first lines 121, a data voltage corresponding to image information is applied to the first electrode 123 according to the signal transmitted through the second lines 122. In addition, a constant common voltage is applied to the second electrode 131. Thus, an electric field is applied to the liquid crystals 150 due to the potential difference between the data voltage and the common voltage, so that the alignment of the liquid crystals 150 is changed. Since the transmittance of the light passing through the liquid crystals 150 may vary depending on the alignment state of the liquid crystals 150, the image corresponding to the alignment state of the liquid crystals 150 is displayed.

During the operation of the display device, light must be provided to the liquid crystals 150 to display the image because the liquid crystals 150 are non-emissive elements. Such a light is provided from the backlight unit 101. The light emitting device according to first to seventh embodiments of the present invention can be used as the backlight unit 101. The light emitting device according to first to seventh embodiments of the present invention represents high brightness and long life span, so the brightness and life span of the display device employing the light emitting device can be improved.

Figure 11:
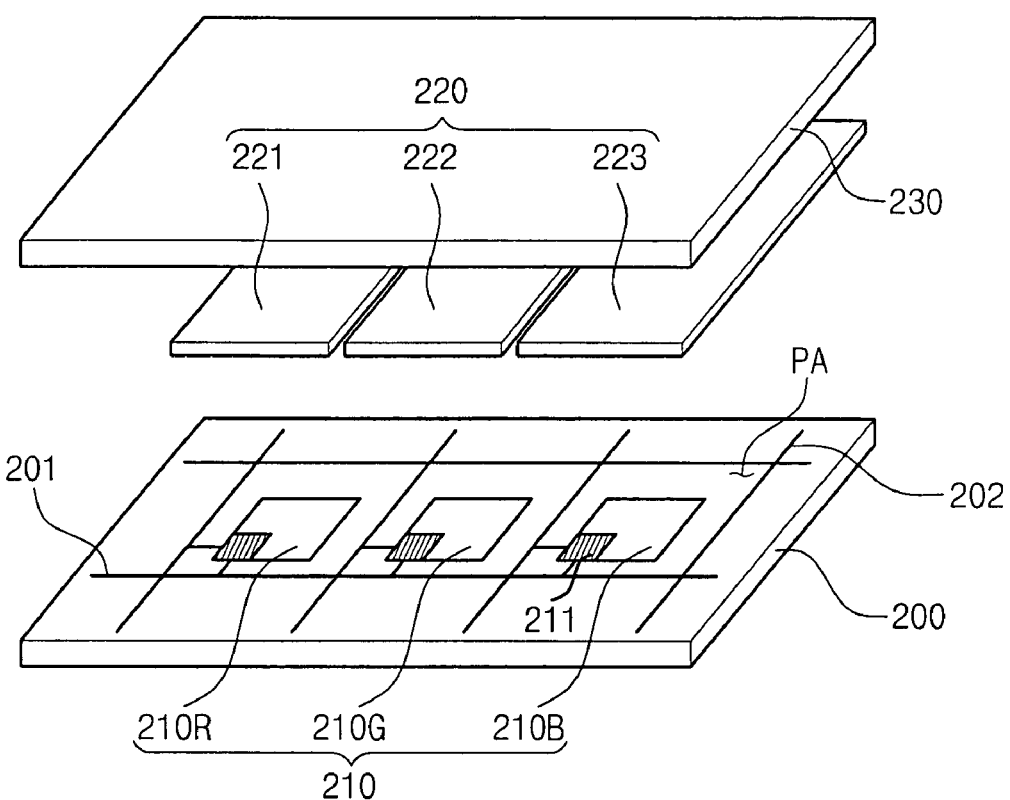
FIG. 11 is a perspective view illustrating a display device according to a second embodiment of the present invention.

FIG. 11 is a perspective view illustrating a display device according to a second embodiment of the present invention.

Referring to FIG. 11, the display device includes a substrate 200, a first electrode 210, a light emitting layer 220, and a second electrode 230. The substrate 200 is provided with a plurality of first and second lines 201 and 202. The first and second lines 201 and 202 cross each other in the form of a matrix while being insulated from each other. Thus, a plurality of the pixel areas PA are defined by means of the first and second lines 201 and 202. Each pixel area PA includes a first electrode 210 and a thin film transistor 211. The first electrode 210 includes a first sub-electrode 210R, a second sub-electrode 210G, and a third sub-electrode 210B. The light emitting layer 220 includes first to third light emitting layers 221, 222 and 223 corresponding to the first to third sub-electrodes 210R, 210G and 210B. The first sub-electrode 210R controls the first light emitting layer 221 such that the first light emitting layer 221 can emit the red light. In the same manner, the second and third sub-electrodes 210G and 210B control the second and third light emitting layers 222 and 223 such that the second and third light emitting layers 222 and 223 can emit the green and blue lights, respectively. The first electrode 210 corresponds to one pixel electrode which is a basic element representing the image. In addition, images having various colors can be displayed by variously combining red, green and blue colors.

As described above, the light emitting device and the display device using the same according to the present invention can improve the brightness and expand the life span.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A light emitting device comprising:
    a substrate;
    a first electrode formed on a top surface of the substrate;
    a light emitting layer formed on a top surface of the first electrode and including an emissive element generating a light;
    a second electrode formed on a top surface of the light emitting layer; and
    an auxiliary layer disposed adjacent to a bottom surface of the substrate opposing a light emitting direction of the light, the auxiliary layer having a refractive index lower than that of the substrate.

2. The light emitting device of claim 1, wherein the light comprises a white light.

3. The light emitting device of claim 1, wherein the light emitting layer comprises:
    a first light emitting layer generating a red light;
    a second light emitting layer generating a green light; and
    a third light emitting layer generating a blue light,
    wherein the first light emitting layer, the second light emitting layer, and the third light emitting layer are separated from each other on the top surface of the first electrode.

4. The light emitting device of claim 1, wherein the auxiliary layer is provided therein with light reflection particles which convert the path of the light when the light is incident into the auxiliary layer from the substrate.

5. The light emitting device of claim 1, wherein the auxiliary layer comprises at least two layers, in which a lower layer has a refractive index lower than that of an upper layer.

6. The light emitting device of claim 1, wherein the substrate has flexibility.

7. The light emitting device of claim 1, wherein the substrate has inflexibility.

8. The light emitting device of claim 1, further comprising a protective layer which is formed on the second electrode to cover an entire surface of the substrate while protecting the light emitting layer.

9. The light emitting device of claim 8, wherein the protective layer comprises a material identical to a material forming the substrate.

10. The light emitting device of claim 8, further comprising an intermediate layer, wherein the intermediate layer is interposed between the protective layer and the second electrode so as to convert the path of the light, which has been incident into the intermediate layer while being tilted relative to the second electrode, into a direction perpendicular to the second electrode.

11. The light emitting device of claim 1, wherein the emissive element comprises an organic compound.

12. The light emitting device of claim 1, wherein the light emitting layer further comprises an auxiliary light emitting particles distributed in the emissive element to convert a path of the light.

13. The light emitting device of claim 12, wherein the auxiliary light emitting particles have a diameter smaller than a wavelength of the light.

14. The light emitting of claim 13, wherein the light comprises a blue light and the auxiliary light emitting particles have a diameter smaller than a wavelength of the blue light.

15. A display device comprising:
   a display panel that displays an image; and
   a backlight unit installed below the display panel to provide light to the display panel,
   the backlight unit comprising:
   a substrate;
      a first electrode formed on a top surface of the substrate;
      a light emitting layer formed on a top surface of the first electrode and including an emissive element generating a light and auxiliary light emitting particles distributed in the emissive element to convert a path of the light; and
      a second electrode formed on a top surface of the light emitting layer;
      wherein the light emitting layer further includes a first light emitting layer, a second light emitting layer and a third light emitting layer each disposed separated from each other on the top surface of the first electrode, the first, second and third light emitting layers emitting colors different from each other.

16. The display device of claim 15, wherein the auxiliary light emitting particles have a diameter smaller than a wavelength of the light.

17. The display device of claim 15, wherein the light comprises a blue light and the auxiliary light emitting particles have a diameter smaller than a wavelength of the blue light.

18. The display device of claim 15, wherein the light comprises a white light.

19. The display device of claim 15, wherein the light emitting layer comprises:
   the first light emitting layer generating a red light;
   the second light emitting layer generating a green light; and
   the third light emitting layer generating a blue light.

20. The display device of claim 15, wherein the display panel comprises:
   two transparent substrates that face each other; and
   a liquid crystal layer interposed between the two transparent substrates.

21. A display device comprising:
   a substrate on which pixel areas are defined;
   a first electrode formed in each pixel area of the substrate;
   a light emitting layer formed on a top surface of the first electrode and including an emissive element generating a light and auxiliary light emitting particles distributed in the emissive element to convert a path of the light;
   a second electrode formed on a top surface of the light emitting layer; and
   an auxiliary layer disposed adjacent to a bottom surface of the substrate opposing a light emitting direction of the light, the auxiliary layer having a refractive index lower than that of the substrate.

22. The display device of claim 21, wherein the first electrode comprises first to third sub-electrodes, which are distinguished from each other, and
   the light emitting layer comprises:
      a first light emitting layer generating a red light in correspondence with the first sub-electrode;
      a second light emitting layer generating a green light in correspondence with the second sub-electrode; and
      a third light emitting layer generating a blue light in correspondence with the third sub-electrode.

* * * * *